US006985707B2

(12) United States Patent
Kasperkovitz

(10) Patent No.: US 6,985,707 B2
(45) Date of Patent: Jan. 10, 2006

(54) RECEIVER WITH AGC CONTROLLED RESONANCE AMPLIFIER

(75) Inventor: Wolfdietrich Georg Kasperkovitz, Waalre (NL)

(73) Assignee: Semiconductor Ideas to Market (ITOM) B.V., Breda (NL)

( * ) Notice: Subject to any disclaimer, the term of this patent is extended or adjusted under 35 U.S.C. 154(b) by 366 days.

(21) Appl. No.: 10/470,472

(22) PCT Filed: Jan. 18, 2002

(86) PCT No.: PCT/EP02/00528

§ 371 (c)(1), (2), (4) Date: Jul. 28, 2003

(87) PCT Pub. No.: WO02/071604

PCT Pub. Date: Sep. 12, 2002

(65) Prior Publication Data

US 2004/0053585 A1 Mar. 18, 2004

(30) Foreign Application Priority Data

Feb. 2, 2001 (EP) ................................. 01200399

(51) Int. Cl.
*H04B 1/06* (2006.01)
*H04B 7/00* (2006.01)

(52) U.S. Cl. ............................... 455/234.1; 455/240.1; 455/311; 330/98; 330/254

(58) Field of Classification Search ............... 455/63.1, 455/67.13, 232.1, 234.1, 240.1, 245.1, 250.1, 455/296, 311; 330/85, 98, 252, 254, 302
See application file for complete search history.

(56) References Cited

U.S. PATENT DOCUMENTS

| | | | | |
|---|---|---|---|---|
| 3,886,467 A * | 5/1975 | Watanabe et al. | ........... | 330/302 |
| 4,731,588 A * | 3/1988 | Addis et al. | ................ | 330/254 |
| 5,041,793 A | 8/1991 | Gailus | | |
| 5,220,686 A | 6/1993 | Kasperkovitz et al. | | |
| 5,270,916 A | 12/1993 | Sexton et al. | | |
| 5,339,048 A * | 8/1994 | Weber | ........................ | 330/302 |
| 5,417,221 A | 5/1995 | Sickler | | |

* cited by examiner

*Primary Examiner*—Quochien B. Vuong
(74) *Attorney, Agent, or Firm*—Robert M. McDermott, Esq.

(57) ABSTRACT

Receiver comprising a resonance amplifier for selectively amplifying a modulated carrier signal being coupled to signal demodulator for narrow band demodulation. The resonance amplifier comprising a cascade of first and second transconductance amplifiers (TC1, TC2) being included in a loop, outputs thereof being coupled via first and second parallel RC filters (R1C1; R2C2) to inputs of the second and first transconductance amplifiers (TC1, TC2), respectively, the loop also includes a signal inverter (INV) for signal inversion. Inputs and outputs of third and fourth transconductance amplifiers (TC3, TC4) are coupled to outputs of the first and second transconductance amplifiers (TC1, TC2), respectively, to effectuate a negative resistance value across the first and second parallel RC filters (R1C1, R2C2), respectively, varying with the gain of the third and fourth transconductance amplifiers (TC3, TC4), fifth and sixth transconductance amplifiers (TC5, TC6) are coupled between inputs and outputs of the resonance amplifier. In order to reduce the overall noise figure of the receiver, the AGC signal generator derives first and second control signals (Iq, Id) from the first DC signal (A), the control signals (Iq, Id) being supplied to gain control inputs of the third to sixth transconductance amplifiers (TC3, TC4, TC5, TC6).

20 Claims, 5 Drawing Sheets

RECEIVER WITH AGC CONTROLLED RESONANCE AMPLIFIER

The invention relates to a receiver comprising a resonance amplifier for selectively amplifying a modulated carrier signal being coupled to signal demodulation means for narrow band demodulation of said carrier signal providing an RF carrier level indicative, first DC signal being supplied to a first input of AGC signal generating means, said resonance amplifier having a cascade of first and second transconductance amplifiers being included in a loop, outputs thereof being coupled via first and second parallel RC filters to inputs of the second and first transconductance amplifiers, respectively, said loop also including means for signal inversion, inputs and outputs of third and fourth transconductance amplifiers being coupled to outputs of said first and second transconductance amplifiers, respectively, to effectuate a negative resistance value across said first and second parallel RC filters, respectively, varying with the gain of said third and fourth transconductance amplifiers, fifth and sixth transconductance amplifiers being coupled between inputs and outputs of said resonance amplifier. Such receiver is known e.g. from U.S. Pat. No. 5,220,686 being herein incorporated by reference.

The known receiver comprises an automatic gain control (AGC) to stabilize the output signal of the signal demodulation means against variations of the RF reception field strength. The AGC signal generating means therefore derives from an RF carrier level indicative DC signal reflecting said RF reception field strength, a single control signal for a cascade of resonance amplifiers. This single control signal, hereinafter being referred to as first control signal, is used to vary the gain of said third and fourth transconductance amplifiers of each resonance amplifier in the cascade, such that at a decreasing RF reception field strength the resonance amplifiers increase in both gain and selectivity. This results not only in amplitude stabilization but also in an adaptive noise level stabilization.

However, in the partial compensation of the positive resistance of the first and second parallel RC filters by the negative resistance provided by the third and fourth transconductance amplifiers the noise generated by said positive resistance adds to the noise generated by said negative resistance. Dependent on the actual values of these resistances, an increase in gain in response to a decrease in RF reception field strength, causes the noise figure of the resonance amplifier to increase more than proportional, therewith deteriorating the overall noise figure of the receiver as a whole.

It is a first object of the invention to improve the noise figure of a receiver as referred to hereabove.

It is a second object of the invention to increase the dynamic range and the dynamic selectivity of such known receiver.

It is a third object of the invention to secure control stability.

It is a fourth object of the invention to simplify the receiver concept providing optimization in terms of low noise figure and maximum dynamic range.

Now therefore, according to one of its aspects the invention is characterized by said AGC signal generating means deriving first and second control signals from said first DC signal, said first control signal being supplied to gain control inputs of said third and fourth transconductance amplifiers and said second control signal being supplied to gain control inputs of said fifth and sixth transconductance amplifiers, the first and second control signals increasing at an increase of the first DC signal and vice versa, the first control signal stronger than the second control signal.

By applying the measure according to the invention the overall gain increase in the resonance amplifier, occurring in response to a decrease in the RF reception field strength of a wanted RF signal, is shared between a substantially frequency indifferent or wideband gain increase provided by the fifth and sixth transconductance amplifiers and a selective gain increase provided by the third and fourth transconductance amplifiers. This gain sharing reduces the gain to be provided by the third and fourth transconductance amplifiers in order to obtain stabilization of the signal level at the output of the signal demodulation means and inherent thereto also said negative resistance. The noise contribution of these third and fourth transconductance amplifiers in the above partial compensation of the positive resistance of the first and second RC filters is therewith reduced, resulting in a substantial improvement of the overall noise figure of the receiver.

The AGC described so far is immune to RF signals adjacent in frequency to the wanted RF signal carrier. If the RF reception field strength of such adjacent RF signals is much greater than the RF reception field strength of the wanted RF signal, then the dynamic input range of the signal demodulator means may easily be exceeded resulting in a severe deterioration of the demodulation function of said signal demodulation means. In particular, weak RF signals causing the known AGC to increase the gain of the resonance amplifier(s) preceding the demodulation means, give rise to overexcitation of the demodulation means, if being accompanied by strong adjacent RF signals. The simultaneous increase in selectivity appears in practice to be insufficient to effectively suppress strong adjacent transmitter signals and to avoid said overexcitation.

To extend the dynamic receiver input range, while maintaining the above improvement of the overall noise figure, a preferred embodiment of a receiver according to the invention is characterized by wideband level detecting means following the resonance amplifier supplying a wideband RF signal level indicative, second DC signal to a second input of said AGC signal generating means, said second control signal varying with a variation of the second DC signal.

With said second DC signal, this measure introduces a new AGC parameter allowing to reduce the dynamic variation of the wideband output signal of the resonance amplifier to values within the dynamic input range of the signal demodulation means, separately from the narrow band level stabilization obtained at the output of the signal demodulation means with the first DC signal. The signal demodulation means may therewith be prevented from being overexcitated for field strength distributions of transmitter signals, which in practice normally occur.

A further preferred embodiment of a receiver according to the invention allowing to obtain an appropriate gain and selectivity setting of the resonance amplifier with simple circuitry, while preventing instabilities from occurring is characterized in that said second control signal varies opposite to the second DC signal.

An improvement in the wideband and narrowband level stabilization in terms of minimum noise figure and maximum dynamic range is obtained in a further preferred embodiment being characterized in that said first control signal varies substantially in correspondence with the first DC signal and the second control signal in proportion with the first DC signal and opposite to the second DC signal.

A practical embodiment of the latter further preferred embodiment, which takes into account the statistic distribution of weak and strong RF transmitter signals over the RF broadcast frequency range is characterized in that the proportion by which the second control signal varies with the first DC signal is in the order of magnitude of one quarter.

Another preferred embodiment of a receiver according to the invention using the above new AGC parameter to obtain an appropriate gain and selectivity setting of the resonance amplifier in terms of noise figure and dynamic selectivity, while preventing instabilities from occurring is characterized in that said second control signal decreases at a decrease of the second DC signal.

To optimize the gain and selectivity setting of the resonance amplifier, the latter embodiment is preferably characterized in that said first control signal varies substantially in correspondence with the first DC signal and opposite to the second DC signal and said second control signal substantially in correspondence with the product value of the first and second DC signals.

To set the respective stabilization levels at the output of the signal demodulation means and at the output of the resonance amplifier to appropriate values, another preferred embodiment of the invention is characterized by said signal demodulation means and said wideband level detecting means being coupled through first and second DC signal generating means to the first and second inputs of said AGC signal generating means in which the RF carrier level and the wideband RF signal level are being compared with first and second setlevel values, respectively.

For reason of stability the second set level is preferably chosen to be greater than the first setlevel.

Yet another preferred embodiment of a receiver according to the invention is characterized by a local tuning oscillator being controlled by a tuning voltage and providing a local RF oscillator signal to a synchronous RF demodulator included in said signal demodulation means, said tuning voltage being supplied to gain control inputs of said first and second transconductance amplifiers of said resonance amplifier.

This measure provides accurate parallel tuning of the passband characteristic of the resonance amplifier and the synchronous detection of the wanted RF signal by the synchronous RF demodulator.

Another preferred embodiment of the invention improving separation in AGC between the first and second DC signals is characterised by said tuneable resonance amplifier supplying a pair of phase quadrature RF signals to a square law envelope detector included in said wideband level detecting means.

By applying this measure, wideband RF signal detection is obtained by square law envelope detection of the RF signals at the output of the resonance amplifier(s) applying quadrating of the phase quadrature RF I and Q signal components thereof, therewith increasing level differences between a weak wanted RF signal and its strong adjacent RF signals.

These and further aspects and advantages of the invention will be discussed more in detail hereinafter with reference to the disclosure of preferred embodiments, and in particular with reference to the appended Figures in which like reference numerals refer to like elements wherein.

Figure 2:
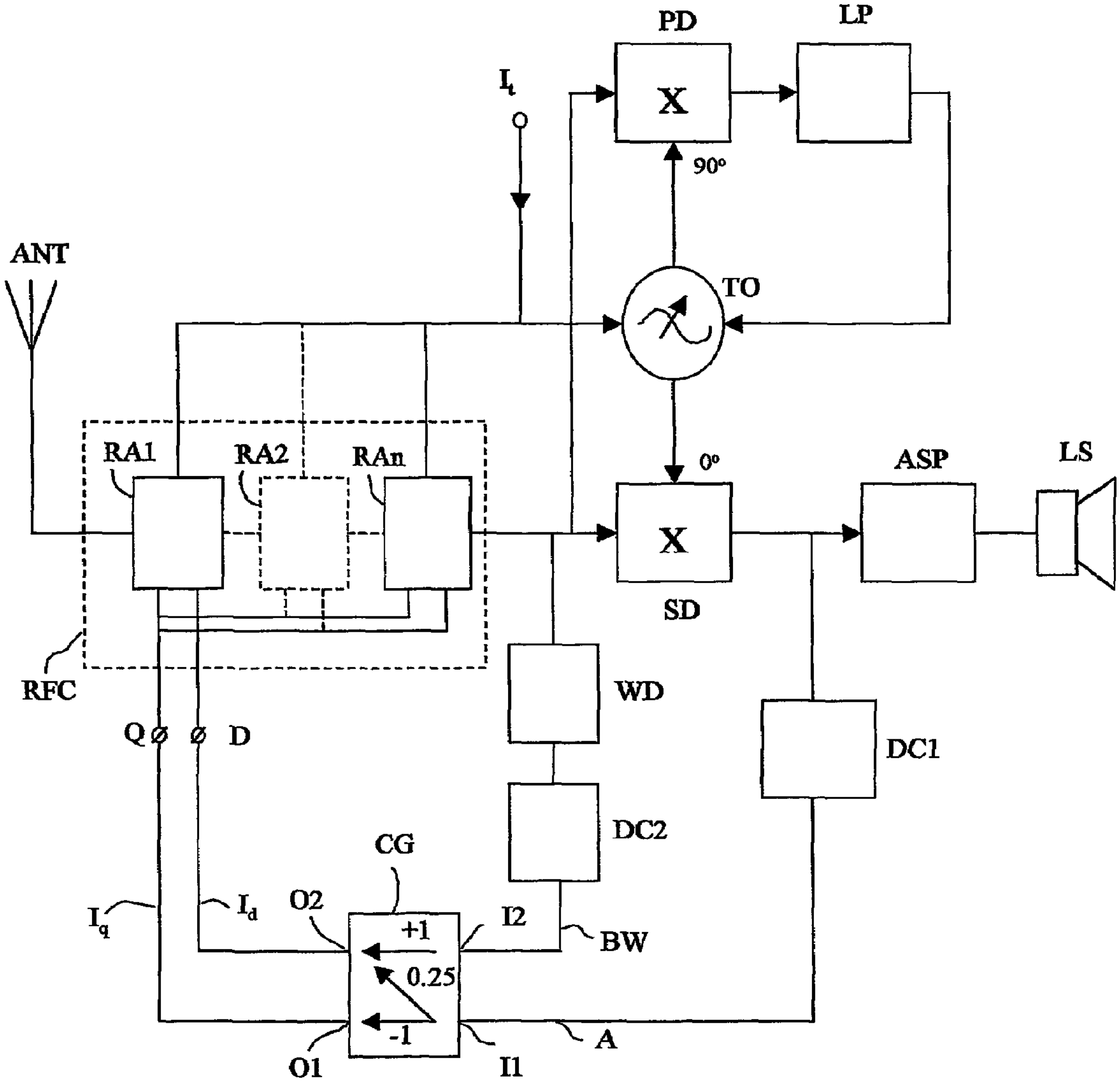
FIG. 2 is a block diagram of a preferred embodiment of a receiver according to the invention.
Figure 3A:
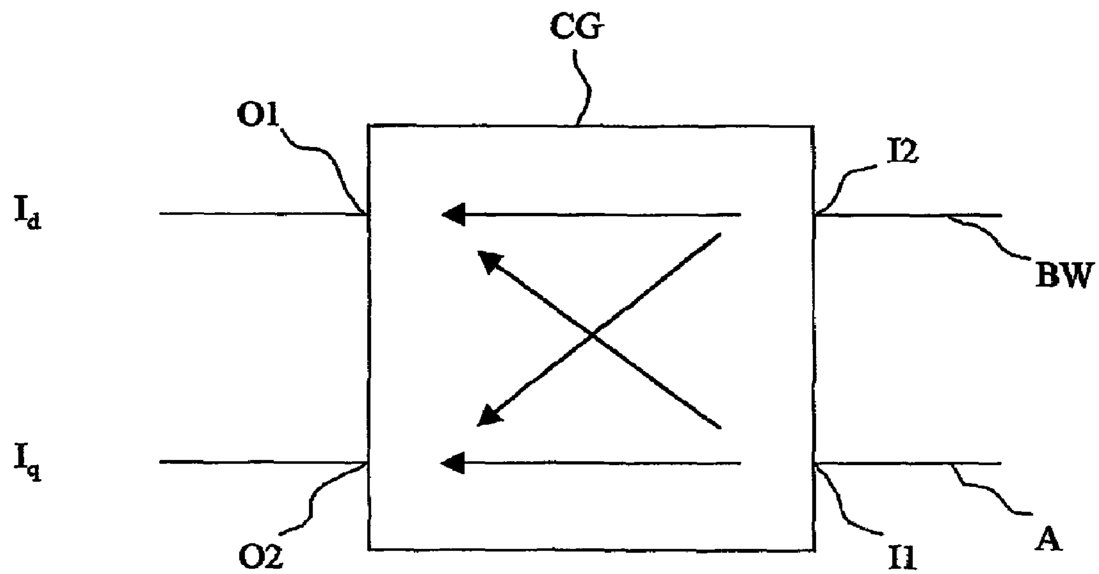
Figure 3B:
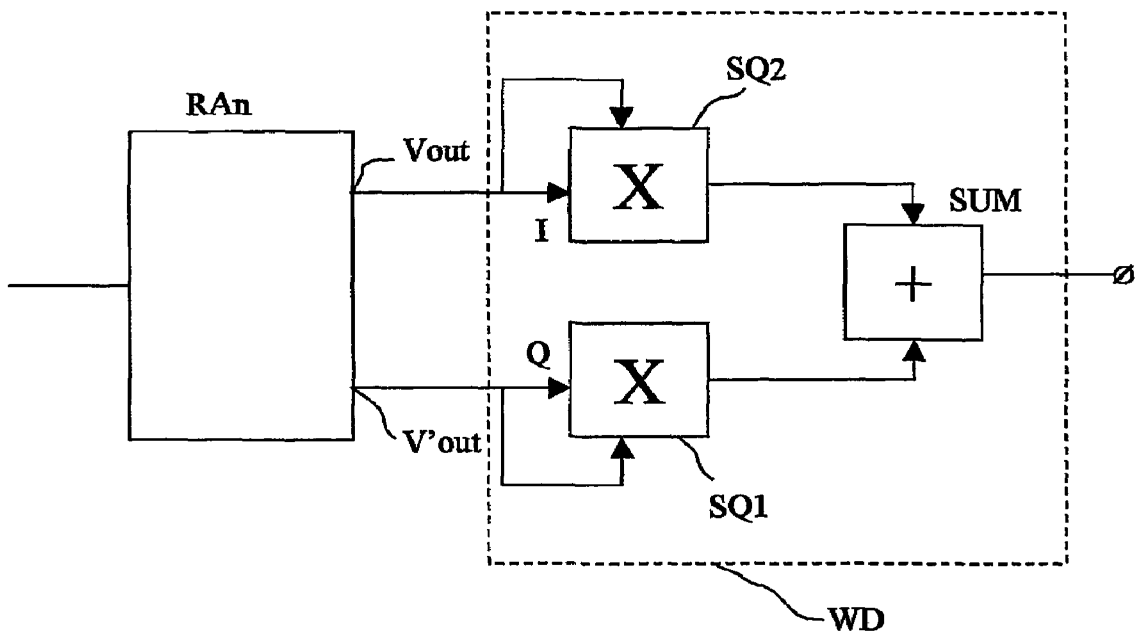
Figure 4:
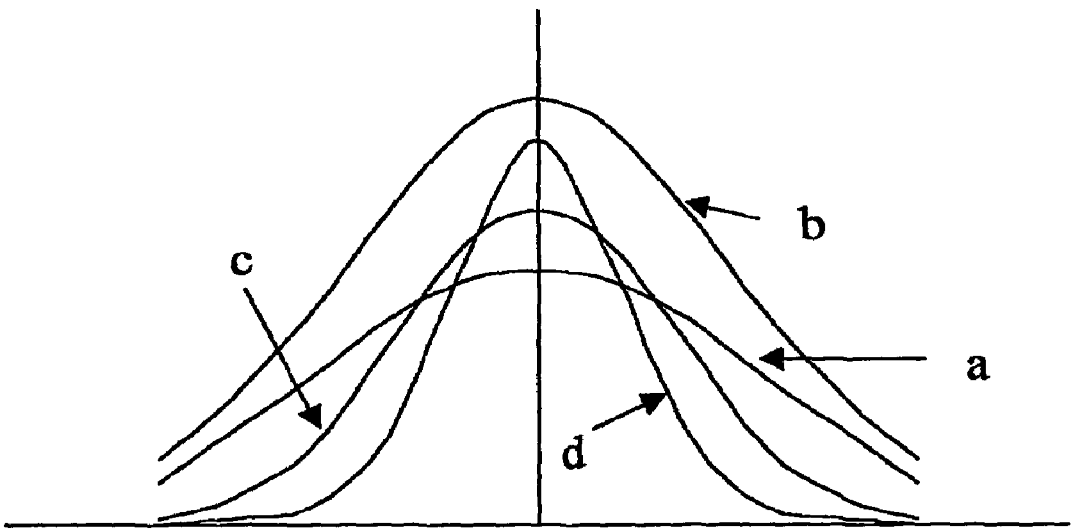

FIG. 3*a* is a block diagram of a wideband an alternative embodiment of the AGC signal generating means CG as used in the receiver of FIG. 2;

FIG. 3*b* is a block diagram of a square law envelope detector for use as wideband level detecting means WD in a receiver according to the invention;

FIG. 4 is a signal plot illustrating the functioning of the AGC system in the receiver of FIG. 2.

Figure 1:
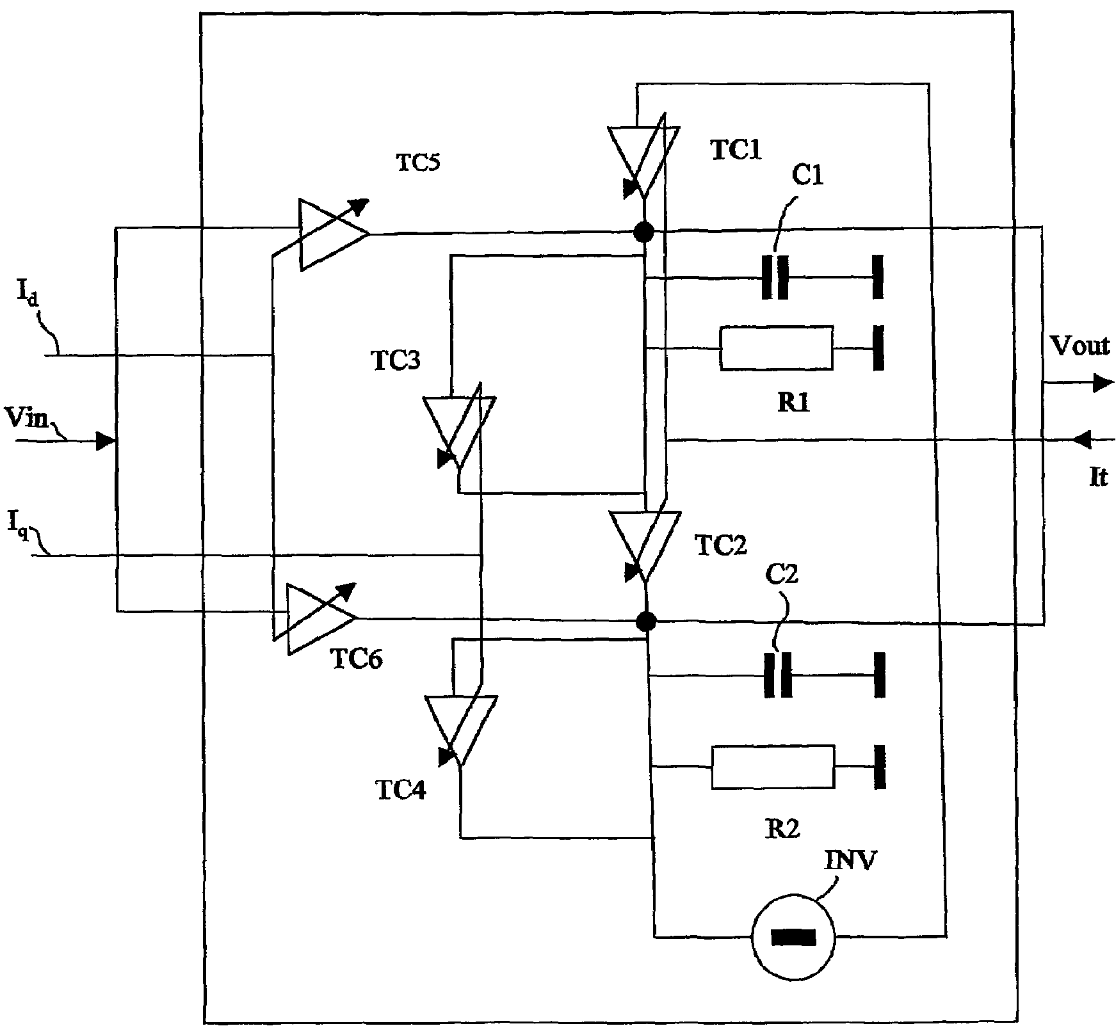
FIG. 1 is a schematic diagram of a prior art resonance amplifier.

FIG. 1 shows a prior art tunable resonance amplifier RA comprising a cascade of first and second gain controlled transconductance amplifiers TC1 and TC2 being included in a non-regenerative DC negative feedback loop. An output of TC2 is therein negatively fed back through an inverter INV to an input of TC1 and outputs of TC1 and TC2 being coupled to respective mass connected parallel RC members R1C1 and R2C2, TC1 and R1C1 respectively TC2 and R2C2 functioning as first and second active poly-phase transconductance filter sections. The common connections of TC1 and R1C1, respectively TC2 and R2C2, constitute quadrature current inputs Iin, respectively I'in and/or quadrature voltage outputs Vout, respectively V'out. By supplying a tuning control current It to control terminals of said first and second gain controlled transconductance amplifiers TC1 and TC2 the gain of TC1 and TC2 is varied and therewith the resonance frequency fres or center passband frequency of the tuneable resonance amplifier RA.

The tuneable resonance amplifier RA is also provided with third and fourth controllable transconductance amplifiers TC3 and TC4, each of which is fed back from the output to the input and is arranged at the outputs of TC1 and TC2, respectively. These transconductance amplifiers TC3 and TC4 provide negative resistances being arranged parallel to the parallel RC members R1C1 and R2C2, respectively. Fifth and sixth transconductance amplifiers TC5 and TC6 are included between quadrature voltage inputs Vin and V'in of the tuneable resonance amplifier RA on the one hand and the above current inputs Iin and I'in of the tuneable resonance amplifier RA on the other hand.

In a phase quadrature mode of operation, the quadrature voltage inputs Vin and V'in and/or the quadrature voltage outputs Vout and V'out of the tuneable resonance amplifier RA are available for supplying thereto and/or taking therefrom a pair of phase quadrature signals. In a single phase mode of operation, the quadrature voltage inputs Vin and V'in, respectively the quadrature voltage outputs Vout and V'out are mutually coupled allowing to use the tuneable resonance amplifier RA to selectively amplify a single phase RF input signal into a single phase RF output signal.

The gain of the third and fourth controllable transconductance amplifiers TC3 and TC4 can be varied by means of a first control signal Iq. Such gain variation causes the above negative resistances being arranged parallel to the parallel RC members R1C1 and R2C2 to vary as well and along therewith the bandwidth or selectivity of the tuneable resonance amplifier RA as a whole. A variation in the second control current Iq therefore results in a variation of the selective gain of the resonance amplifier RA.

A frequency indifferent variation of the overall gain of the tuneable resonance amplifier RA without affecting its resonance frequency fres and/or bandwidth is obtained by varying the gain of the transconductance amplifiers TC5 and TC6 by means of a control current Id.

The description of the resonance amplifier RA given so far is sufficient for a proper understanding of the invention. For further details reference is made to U.S. Pat. No. 5,220,686.

FIG. 2 shows a preferred embodiment of a receiver according to the invention, antenna means ANT being coupled to an RF input circuit RFC comprising a cascade of resonance amplifiers RA1 to RAn for selectively amplifying a modulated RF carrier signal. The RE input circuit RFC is coupled to a synchronous demodulator SD functioning as signal demodulation means, as well as to a phase detector PD being included in a phase locked loop (PLL). The phase detector PD is followed therein by a loop filter LP, an output thereof being coupled to a first control input of a voltage controlled oscillator VCO and providing a pair of phase quadrature local RF oscillator signals having RF in-phase and phase quadrature signal components I and Q. A tuning current It is supplied to a second control input of the voltage controlled oscillator VCO allowing to tune the oscillator frequency to the carrier frequency of a wanted RF signal. The voltage controlled oscillator VCO therewith also functions as tuning oscillator TO. The RF in-phase and phase quadrature signal components I and Q are being supplied to local carrier inputs of said phase detector PD and said synchronous demodulator SD, respectively. In an in-lock operation of the PLL, the RF in-phase signal component I of the pair of phase quadrature local RF oscillator signals is phase synchronized with the carrier frequency of the wanted RF signal and effectuates a synchronous demodulation of the wanted RF signal into its baseband modulation signal e.g. an audiosignal. A selection and processing of this baseband audiosignal takes place in an audio signal processing device ASP followed by sound reproduction in a loudspeaker system LS.

To obtain accurate parallel tuning of the passband characteristic of the resonance amplifier(s) of the RF input circuit RFC with the local oscillator frequency, the above tuning voltage Vt is supplied to the tuning oscillator TO and to gain control inputs of said first and second transconductance amplifiers as well.

The synchronous demodulator SD is also coupled through first DC signal generating means DC1 and AGC signal generating means CG to gain and bandwidth control inputs of the resonance amplifiers RA1–RAn of the RF input circuit RFC, therewith forming a first AGC loop, as will be described in more detail hereinafter.

In addition to the above baseband modulation signal the synchronous demodulator SD also provides a narrow band RF carrier level indicative DC signal, which is selected and further processed into a first DC loop signal in said first DC signal generating means DC1. In this further processing the RF carrier level indicative DC signal is being compared with a first setlevel value SL1 and the difference between these signals is given the right polarity for a negative feedback thereof to the resonance amplifiers RA1–RAn. Such DC signal generating means is on itself known, e.g. from Philips' Application Note of one chip AM radio IC TEA 5551T, dated October 1990.

Said first DC loop signal is supplied to a first input I1 of the AGC signal generating means CG. The AGC signal generating means CG derives from said first DC loop signal, first and second control signals Iq and Id, respectively. For the sake of clarity the control in gain and selectivity of the cascade of resonance amplifier RA1–Ran in the RF input circuit RFC function obtained with said first and second control signals Iq and Id is described hereinafter with respect to a single resonance amplifier, however is to be understood to apply to each resonance amplifier in the cascade.

The first and second control signals Iq and Id are being supplied through first and second outputs O1 and O2 of the AGC signal generating means CG to a common gain control input of said third and fourth transconductance amplifiers (TC3, TC4) and a common gain control input of said fifth and sixth transconductance amplifiers (TC5, TC6), respectively. According to one of the aspects of the invention, the first and second control signals (Iq, Id) both increase at an increase of the first DC signal (A) and vice versa, the first control signal (Iq) significantly stronger than the second one (Id). This results in the overall receiver gain variation being shared between the fifth and sixth transconductance amplifiers (TC5, TC6) on the one hand and the third and fourth transconductance amplifiers (TC3, TC4) on the other hand within each of the cascade of resonance amplifier RA1–Ran in the RF input circuit RFC, while maintaining acceptable dynamic selectivity. Compared with the conventional receiver of U.S. Pat. No. 5,220,686 the negative resistance values provided by the third and fourth transconductance amplifiers (TC3, TC4) are smaller and therewith also their noise contribution in the partial compensation of the positive resistance value of the first and second parallel RC filters R1C1, R2C2.

The first AGC loop is effective for variations in the RF carrier level of the wanted RF signal. However, RF signals having a relatively large field strength with respect to the field strength of the wanted RF signal and occurring at relatively small frequency distances from the wanted RF signal, also being referred to as strong adjacent channels, cause the wideband output signal level of the RF input circuit RFC to exceed the dynamic input range of the synchronous demodulator SD in particular when occurring at close frequency distance from the wanted RF signal. In this unwanted mode of operation, also being referred to as overexcitation, the detection of the wanted RF signal in the synchronous demodulator SD is being severely deteriorated. According to a further aspect of the invention, the dynamic range of the wideband output signal level of the RF input circuit RFC, i.e. wideband input signal level of the synchronous demodulator SD, is therefore being reduced to a value within the dynamic input range of the synchronous demodulator SD. For this purpose, a second AGC loop is applied, in which the output of the RF input circuit RFC is coupled through successively wideband level detecting means WD, second DC signal generating means DC2 and said AGC signal generating means CG to gain control inputs of the resonance amplifiers RA1–RAn of the RF input circuit RFC, as will be described in more detail hereinafter.

In said wideband level detecting means WD, the wideband RF output signal of the RF input circuit RFC is being detected to provide a wideband RF signal level indicative DC signal. This wideband RF signal level indicative DC signal is selected and further processed into a second DC loop signal DC2 in second DC signal generating means DC2. In this further processing, the wideband RF signal level indicative DC signal is being compared with a second setlevel value SL2, the difference between these signals is given the right polarity for a negative feedback thereof to the resonance amplifiers RA1–Ran, such that any deviation of said wideband RF signal level indicative DC signal in excess of said second setlevel value SL2 is suppressed. By a proper choice of the second setlevel SL2, the second AGC loop prevents the RF output signal of the RF input circuit RFC from exceeding the dynamic input range of the synchronous demodulator SD and therewith from overexcitation thereof. Unlike the first AGC loop, the second AGC loop is active only for values of the wideband RF signal level indicative DC signal exceeding said second setlevel SL2 and is inactive for smaller values thereof.

Said wideband level detecting means WD may include a wideband envelope detector or preferably a square law envelope detector as will be described in more detail with respect to FIG. 3*b*. Said second DC signal is being supplied to a second input I2 of said AGC signal generating means CG. In a practical embodiment, which takes into account the statistic distribution of normally occurring field strength values of transmitter signals over the RF frequency range of existing radio broadcast systems and which is optimized in minimum noise figure and maximum dynamic selectivity, the first and second control signals Iq and Id are being defined as:

$$Iq(A,\ BW)=Iq^*+A \text{ and}$$

$$Id(A,\ BW)=Id^*+0.25A-BW,$$

in which Iq* and Id* are scaling factors, and in which A and BW represent said first and second DC signals respectively. The proportionality factor of 0.25 is experimentally defined on the basis of the abovementioned statistic distribution of normally occurring field strength values of transmitter signals over the RF broadcast frequency range.

The derivation of Iq and Id from A and BW in the AGC signal generating means CG can be implemented with rather simple circuitry. The AGC process executed by the first and second AGC loops and obtaining stabilization of the RF carrier level indicative DC signal at said first setlevel value SL1 and the wideband RF signal level indicative DC signal will be explained in more detail with reference to FIG. 4.

FIG. 3*a* shows an alternative embodiment of the AGC signal generating means CG allowing for a stable AGC operation on both input and output signals of the synchronous demodulator being optimized in terms of minimum noise figure and maximum dynamic range. Herein, the first and second control signals are preferably defined by:

$$Iq(A,\ BW)=Iq^{**}(A-BW/BW^*)$$

$$Id(A,\ BW)=A.Id^{**}(BW/BW^*)$$

in which Iq, Id and BW* are scaling factors. These formulas effectuate a dependency of the first and second control signals from the first and second DC signals, which is inverse to the typical dependency of the overall gain and bandwidth of a resonance amplifier from the first and second control signals. This results in full separation or orthogonal control of the AGC operation on the gain of the resonance amplifier on the one hand by the first DC signal (A) and the selectivity or bandwidth thereof by the second DC signal (BW) on the other hand.

The implementation of the first and second DC signal generating means DC1 and DC2 belongs to the normal ability of the skilled man. Reference is made in this respect to Philips' Application Note of one chip AM radio IC TEA 5551T, dated October 1990.

To further secure stable AGC operation the second set level value is chosen to be greater than the first setlevel value. Practical values for the first and second setlevel values are 30 mV and 3 mV, respectively.

FIG. 3*b* is a block diagram of a square law envelope detector for use as wideband level detecting means WD in a receiver according to the invention. Such square law envelope detector is on itself known, e.g. from U.S. Pat. No. 4,905,307. For an application thereof in the receiver of FIG. 2, the last resonance amplifier RAn in the cascade of the RF input circuit RFC is to be operated in the above phase quadrature mode, in which the RF output signal of the RF input circuit RFC is available as a pair of phase quadrature RF signals at quadrature voltage output terminals Vout and V'out of the resonance amplifier RSn. The square law envelope detector is a type RMS detector in that it derives said wideband RF signal level indicative DC signal from said pair of phase quadrature RF output signals by quadrating the phase quadrature RF I and Q signal components thereof in first and second quadrating devices SQ1 and SQ2 and subsequent summation of these quadrated RF I and Q signal components in summation device SUM.

As in any other type RMS detector, the RF signal quadrating results in an increase of level differences between a weak wanted RF signal and its strong adjacent REF signals compared with non-RMS type envelope detectors, therewith improving the separation in the derivation of the first and second DC signals. In addition thereto the square law envelope detector does not require the filtering of higher order harmonics as needed in other types of RMS detectors.

FIG. 4 shows in curves a–d various gain/bandwidth characteristics of a single resonance amplifier as applied in the RF input circuit RFC at various settings of the first and second control signals Iq and Id. Suppose the RF carrier level indicative DC signal of an RF reception signal deceases below the first setlevel value SL1 at which gain/bandwidth characteristic of the resonance amplifier is represented by curve a, then in the first AGC loop, the first control signal Iq will increase, causing the resonance amplifier to increase in gain and selectivity (i.e. decrease in bandwidth) as represented by curve b, to allow for a stabilization of the RF carrier level indicative DC signal at said first setlevel value SL1. Dependent on the RF field strength of strong adjacent channels relative to the field strength of the wanted RF signal and their frequency distance to the wanted RF signal, this selective gain increase may cause the wideband RF signal level indicative DC signal in the second AGC loop to exceed the second setlevel value SL2. If so, then the second control signal Id decreases, causing the gain of the resonance amplifier to decrease as well. This decrease in gain is frequency indifferent and results in a gain/bandwidth characteristics of the resonance amplifier amplifier e.g. as given in curve c. This decrease in gain causes the RF carrier level indicative DC signal to decrease below the first setlevel value SL1 again, causing the first control signal Iq in the first AGC loop and the gain and selectivity of the resonance amplifier to increase further, as represented by curve d. This, however, may again cause the wideband RF signal level indicative DC signal in the second AGC loop to exceed the second setlevel value SL2, and so on and so forth until both RF carrier level indicative DC signal and wideband RF signal level indicative DC signal are stabilized at the first and second setlevel values SL1 and SL2, respectively. Note that the bandwidth of curve d is smaller than the bandwidth of curve c, whereas bandwidth of curve c is similar to the bandwidth of curve b, but in its turn smaller than the bandwidth of curve a. The final gain and selectivity setting of the resonance amplifier obtained with this iterative AGC process provide minimum noise figure and maximum dynamic selectivity.

While the invention has been particularly shown and described with reference to the preferred embodiments shown in the Figures, it will be understood by those skilled in the art that various changes in form and details may be made without departing from the spirit and scope of the invention.

For instance, the RF input circuit may comprise any number of single resonance amplifiers in the cascade and may suffice in principle with a single resonance amplifier, other weighting and scaling factors may be used in determining the dependency of the first and second control signals from the first and second DC signals. Also other types of demodulators and/or detection may be used to obtain DC signals indicative for the RE input and/or output signal levels of the signal demodulation means.

What is claimed is:

1. Receiver comprising a resonance amplifier for selectively amplifying a modulated carrier signal, a signal demodulator, operably coupled to the resonance amplifier, for narrow band demodulation of the carrier signal to provide an RF carrier level indicator, an AFC signal generator, a first DC signal (A) being supplied to a first input of the AGC signal generator, the resonance amplifier having a cascade of first and second transconductance amplifiers (TC1, TC2) being included in a loop, outputs thereof being coupled via first and second parallel RC filters (R1C1; R2C2) to inputs of the second and first transconductance amplifiers TC1, TC2), respectively, the loop also including a signal inverter (INV), third and fourth transconductance amplifiers (TC3, TC4) having inputs and outputs coupled to outputs of the first and second transconductance amplifiers (TC1, TC2), respectively, to effectuate a negative resistance value across the first and second parallel RC filters (R1C1, R2C2), respectively, that varies with the gain of the third and fourth transconductance amplifiers (TC3, TC4), fifth and sixth transconductance amplifiers (TC5, TC6) being coupled between inputs and outputs of the resonance amplifier, wherein the AGC signal generator derives first and second control signals (Iq, Id) from the first DC signal (A), the first control signal (Iq) is supplied to gain control inputs of the third and fourth transconductance amplifiers (TC3, TC4) and the second control signal (Id) is supplied to gain control inputs of the fifth and sixth transconductance amplifiers (TC5, TC6), the first and second control signals (Iq, Id) increases at an increase of the first DC signal (A) and vice versa, and the first control signal (Iq) is stronger than the second control signal (Id).

2. Receiver according to claim 1, further including a wideband level detector following the resonance amplifier that supplies a wideband RF signal level indicator, wherein a second DC signal (BW) is coupled to a second input of the AGC signal generator, and the second control signal (Id) varies with a variation of the second DC signal (BW).

3. Receiver according to claim 2, characterized in that the second control signal (Id) varies opposite to the second DC signal (BW).

4. Receiver according to claim 3, characterized in that the first control signal (Iq) varies substantially in correspondence with the first DC signal (A) and the second control signal (Id) varies substantially in proportion with the first DC signal (A) and opposite to the second DC signal (BW).

5. Receiver according to claim 4, characterized in that the proportion by which the second control signal (Id) varies with the first DC signal (A) is in the order of magnitude of one quarter.

6. Receiver according to claim 5, wherein the signal demodulator and the wideband level detector is coupled through a first and second DC signal generator to the first and second inputs of the AGC signal generator in which the RF carrier level and the wideband RF signal level are being compared with first and second setlevel values, respectively.

7. Receiver according to claim 4, wherein the signal demodulator and the wideband level detector is coupled through a first and second DC signal generator to the first and second inputs of the AGC signal generator in which the RF carrier level and the wideband RF signal level are being compared with first and second setlevel values, respectively.

8. Receiver according to claim 3, wherein the signal demodulator and the wideband level detector is coupled through a first and second DC signal generator to the first and second inputs of the AGC signal generator in which the RF carrier level and the wideband RF signal level are being compared with first and second setlevel values, respectively.

9. Receiver according to claim 2, characterized in that the second control signal (Id) decreases at a decrease of the second DC signal (BW).

10. Receiver according to claim 9, wherein the first control signal (Iq) varies substantially in correspondence with the first DC signal (A) and opposite to the second DC signal (BW) and the second control signal (Id) varies substantially in correspondence with the product value of the first and second DC signals (A and BW).

11. Receiver according to claim 10, wherein the signal demodulator and the wideband level detector is coupled through a first and second DC signal generator to the first and second inputs of the AGC signal generator in which the RF carrier level and the wideband RF signal level are being compared with first and second setlevel values, respectively.

12. Receiver according to claim 11, characterized by the second set level value being greater than the first setlevel value.

13. Receiver according to claim 6, wherein the signal demodulator and the wideband level detector is coupled through a first and second DC signal generator to the first and second inputs of the AGC signal generator in which the RF carrier level and the wideband RF signal level are being compared with first and second setlevel values, respectively.

14. Receiver according to claim 2, wherein the signal demodulator and the wideband level detector is coupled through a first and second DC signal generator to the first and second inputs of the AGC signal generator in which the RF carrier level and the wideband RF signal level are being compared with first and second setlevel values, respectively.

15. Receiver according to claim 14, characterized by the second set level value being greater than the first setlevel value.

16. Receiver according to claim 14, further including a local tuning oscillator that is controlled by a tuning voltage and provides a local RF oscillator signal to a synchronous RF demodulator that is included in the signal demodulator, the tuning voltage being supplied to gain control inputs of the first and second transconductance amplifiers of the resonance amplifier.

17. Receiver according to claim 14, wherein the resonance amplifier supplies a pair of phase quadrature RF signals to a square law envelope detector included in the wideband level detector.

18. Receiver according to claim 2, wherein the resonance amplifier supplies a pair of phase quadrature RF signals to a square law envelope detector included in the wideband level detector.

19. Receiver according to claim 2, further including a local tuning oscillator that is controlled by a tuning voltage and provides a local RF oscillator signal to a synchronous RF demodulator that is included in the signal demodulator, the tuning voltage being supplied to gain control inputs of the first and second transconductance amplifiers of the resonance amplifier.

20. Receiver according to claim 1, further including a local tuning oscillator that is controlled by a tuning voltage and provides a local RF oscillator signal to a synchronous RF demodulator that is included in the signal demodulator, the tuning voltage being supplied to gain control inputs of the first and second transconductance amplifiers of the resonance amplifier.

* * * * *